(12) United States Patent
Yu et al.

(10) Patent No.: US 10,050,130 B2
(45) Date of Patent: Aug. 14, 2018

(54) METHOD OF FABRICATING A SEMICONDUCTOR STRUCTURE BY ASYMMETRIC OXIDATION OF FIN MATERIAL FORMED UNDER GATE STACK

(71) Applicants: Semiconductor Manufacturing International (Shanghai) Corporation, Shanghai (CN); Semiconductor Manufacturing International (Beijing) Corporation, Beijing (CN)

(72) Inventors: Guo Bin Yu, Shanghai (CN); Xiao Ping Xu, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/398,817

(22) Filed: Jan. 5, 2017

(65) Prior Publication Data
US 2017/0229560 A1  Aug. 10, 2017

(30) Foreign Application Priority Data

Feb. 4, 2016 (CN) .......................... 2016 1 0081033

(51) Int. Cl.
*H01L 29/66* (2006.01)
*H01L 21/02* (2006.01)
(Continued)

(52) U.S. Cl.
CPC .. *H01L 29/66818* (2013.01); *H01L 21/02236* (2013.01); *H01L 21/26506* (2013.01);
(Continued)

(58) Field of Classification Search
CPC ......... H01L 21/02236; H01L 21/26506; H01L 21/26586; H01L 21/3065; H01L 21/308;
(Continued)

(56) References Cited

U.S. PATENT DOCUMENTS

2005/0110085 A1   5/2005 Zhu et al.
2005/0245009 A1*  11/2005 Bryant .............. H01L 29/42368
                                                    438/151
(Continued)

OTHER PUBLICATIONS

European Patent Office (EPO) The Extended European Search Report for 17153089.2 Jun. 29, 2017 8 Pages.

*Primary Examiner* — Marc Armand
*Assistant Examiner* — Younes Boulghassoul
(74) *Attorney, Agent, or Firm* — Anova Law Group, PLLC (57) ABSTRACT

The present disclosure provides semiconductor structures and fabrication methods thereof. An exemplary fabrication method includes providing a semiconductor substrate; forming a plurality of fins on the semiconductor substrate, each fin having a first sidewall surface and an opposing second sidewall surface; performing an asymmetric oxidation process on the fins to oxidize the first sidewall surfaces of the fins to form a first oxide layer, and to oxidize the second sidewall surfaces of the fins to form a second oxide layer, a thickness of the first oxide layer being different from a thickness of the second oxide layer, and un-oxidized portions of the fins between the first oxide layer and the second oxide layer being configured as channel layers; removing the second oxide layer and a partial thickness of the first oxide layer; and forming a gate structure crossing over the channel layers over the semiconductor substrate.

20 Claims, 3 Drawing Sheets

(51) Int. Cl.
*H01L 21/265* (2006.01)
*H01L 21/3065* (2006.01)
*H01L 21/308* (2006.01)
*H01L 21/311* (2006.01)
*H01L 29/78* (2006.01)
*H01L 29/06* (2006.01)
*H01L 29/10* (2006.01)
*H01L 29/08* (2006.01)

(52) U.S. Cl.
CPC ...... *H01L 21/26586* (2013.01); *H01L 21/308* (2013.01); *H01L 21/3065* (2013.01); *H01L 21/31111* (2013.01); *H01L 29/0653* (2013.01); *H01L 29/0847* (2013.01); *H01L 29/1037* (2013.01); *H01L 29/66803* (2013.01); *H01L 29/7851* (2013.01)

(58) Field of Classification Search
CPC ............. H01L 21/31111; H01L 21/336; H01L 21/3088; H01L 21/3081; H01L 21/3085; H01L 21/3086; H01L 21/3083; H01L 21/823807; H01L 21/8221; H01L 21/823864; H01L 21/32115; H01L 21/823431; H01L 21/845; H01L 21/461; H01L 21/02164; H01L 21/0228; H01L 21/31116; H01L 21/823468; H01L 27/1052; H01L 27/108; H01L 27/10826; H01L 27/10879; H01L 27/10894; H01L 27/1104; H01L 27/0207; H01L 27/1211; H01L 29/66818; H01L 29/0653; H01L 29/0847; H01L 29/1037; H01L 29/66803; H01L 29/7851; H01L 29/78; H01L 29/7856; H01L 29/7831; H01L 29/785; H01L 29/66; H01L 29/6681
USPC ................ 257/401, 347, 314, 368, E29.264, 257/E21.409, E21.415, E21.421; 438/157, 695, 585, 390, 283, 151, 275, 438/618, 288, 165, 532, 736, 717, 694
See application file for complete search history.

(56) References Cited

U.S. PATENT DOCUMENTS

| | | | |
|---|---|---|---|
| 2006/0091433 A1 | 5/2006 | Nishinohara | |
| 2006/0223335 A1* | 10/2006 | Mathew | H01L 21/26506 438/766 |
| 2007/0029623 A1* | 2/2007 | Liu | H01L 29/42384 257/401 |
| 2009/0032872 A1* | 2/2009 | Giles | H01L 21/26586 257/347 |
| 2015/0200276 A1* | 7/2015 | Cheng | H01L 29/66818 257/401 |

* cited by examiner

METHOD OF FABRICATING A SEMICONDUCTOR STRUCTURE BY ASYMMETRIC OXIDATION OF FIN MATERIAL FORMED UNDER GATE STACK

CROSS-REFERENCES TO RELATED APPLICATIONS

This application claims the priority of Chinese patent application No. 201610081033.2, filed on Feb. 4, 2016, the entirety of which is incorporated herein by reference.

FIELD OF THE INVENTION

The present invention generally relates to the field of semiconductor manufacturing technology and, more particularly, relates to semiconductor structures and fabrication methods thereof.

BACKGROUND

With the rapid development of semiconductor technologies, semiconductor devices have been developed toward higher integration level, and higher speed. The effective lengths of the gate structures of the semiconductor devices have become smaller and smaller. Such an effective length reduction of the gate structures reduces the control ability of the gate structures on the channel regions of transistors.

The gate structure of a fin field-effect transistor (FinFET) forms a fin-shaped and branched three-dimensional (3D) structure. One or more fins protruding from the channel region of the FinFET is formed on a substrate. The gate structure covers the side and top surfaces of the one or more fins. Thus, inversion layers are formed on the two sides of the channel region; and the FinFET can be controlled to be on/off from two sides. Such a design increases the control ability of the gate structure on the channel region; and is able to better reduce the short channel effect.

However, the semiconductor structures formed by the existing techniques still have less control ability on the channel region, but with large leakage current. The disclosed device structures and methods are directed to solve one or more problems set forth above and other problems in the art.

BRIEF SUMMARY OF THE DISCLOSURE

One aspect of the present disclosure includes a method for fabricating a semiconductor structure. The method includes providing a semiconductor substrate; forming a plurality of fins on the semiconductor substrate, each fin having a first sidewall surface and an opposing second sidewall surface; performing an asymmetric oxidation process on sidewall surfaces of the fins to oxidize the first sidewall surfaces of the fins to form a first oxide layer, and to oxidize the second sidewall surfaces of the fins to form a second oxide layer, a thickness of the first oxide layer being different from a thickness of the second oxide layer, and un-oxidized portions of the fins between the first oxide layer and the second oxide layer being configured as channel layers; removing the second oxide layer and a partial thickness of the first oxide layer; and forming a gate structure crossing over the channel layers over the semiconductor substrate.

Another aspect of the present disclosure includes a semiconductor structure. The semiconductor structure includes a semiconductor substrate; a plurality of fins formed on the semiconductor substrate, each fin including a channel layer and a side oxide layer doped with a certain type of ions formed on one surface of the channel layer; and a gate structure, crossing over the fins, and covering one sidewall surface of each channel layer and top surfaces of the channel layers, and one sidewall surface of the side oxide layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

The semiconductor structures formed by the existing techniques may still have certain issues. For example, the gate of the semiconductor structure has less control ability on the channel region; and the channel region has a relatively large leakage current. The reasons for such issues may be further analyzed according to the fabrication processes.

In the existing fabrication process of the semiconductor structure, the fins are formed by patterning a substrate, followed by forming a gate structure on portions of the side and top surfaces of the fins. The gate structure covers portions of the side and top surfaces of the fins. Thus, the channel regions are distributed on the side and top surfaces of the fins; and are easy to extend into the fins. Accordingly, the thickness of the channel regions in the fins is relatively large. Therefore, the control ability of the gate structure on the channel region is relatively small; and is unable to effectively reduce the short channel effect.

The present disclosure provides a semiconductor structure and a method for forming a semiconductor structure. The method may include providing a base substrate. The base substrate may include a semiconductor substrate and a plurality of fins formed on the surface of the semiconductor substrate. Each fin may include a first sidewall surface and an opposing second sidewall surface. The method may also include performing an asymmetrical oxidation process to form a first oxide layer on the first sidewall surfaces of the fins and a second oxide layer on the second sidewall surfaces of the fins. The thickness of the first oxide layer may be greater than the thickness of the second oxide layer. The first oxide layer and the second oxide layer are separated by the un-oxidized portions of the fins. The un-oxidized portions of the fins may be configured as the channel layers. Further, the method may include removing the second oxide layer and a partial thickness of the first oxide layer to expose one sidewall surface of each channel layers. A partial thickness of the first oxide layer may be left on the other sidewall surfaces of the fins. Further, the method may include forming a gate structure crossing over the channel layers. The gate structure may cover portions of the sidewall surfaces of the channel layers and top surfaces of the channel layers.

In the disclosed fabrication method of the semiconductor structure, after the asymmetric oxidation process, the thicknesses of the oxide layers on the two sidewall surfaces of the fins may be different. Thus, during the process for etching the oxide layers, the second oxide layer may be removed; and a partial thickness of the first oxide layer may be removed. Accordingly, the first sidewall surface of the fins may still be covered by the remaining first oxide layer; and the thickness of the channel layers may be relatively small. The channel regions of the transistors may be distributed in the channel layers. Thus, the thickness of the channel regions may be reduced. Accordingly, the control ability of the gate structure of the FinFET to the channel region may be increased and the short channel effect may be reduced; and the leakage current in the channel regions may be reduced. Comparing with the conventional planar transistors, the disclosed semiconductor structures may form a stacked structure having an insulator and a signal crystal structure along a direction perpendicular to the sidewall surfaces of the fins. Thus, the integration level may be increased.

Figure 4:
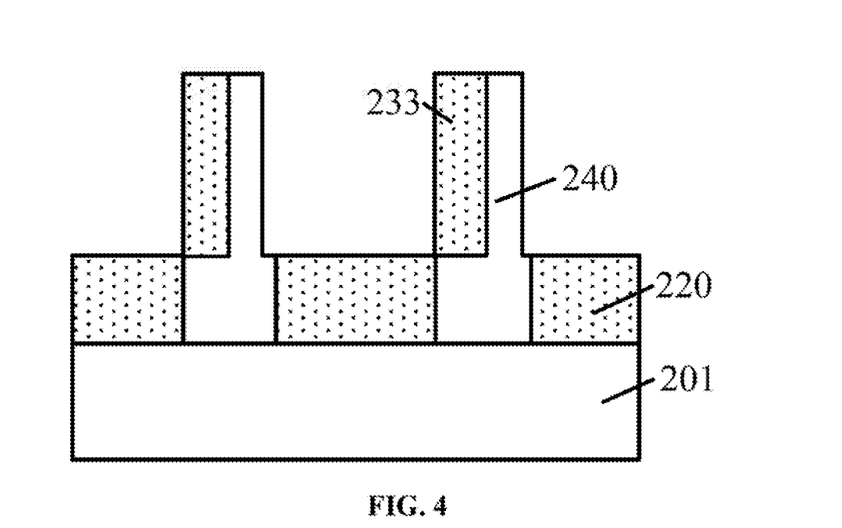
Figure 5:
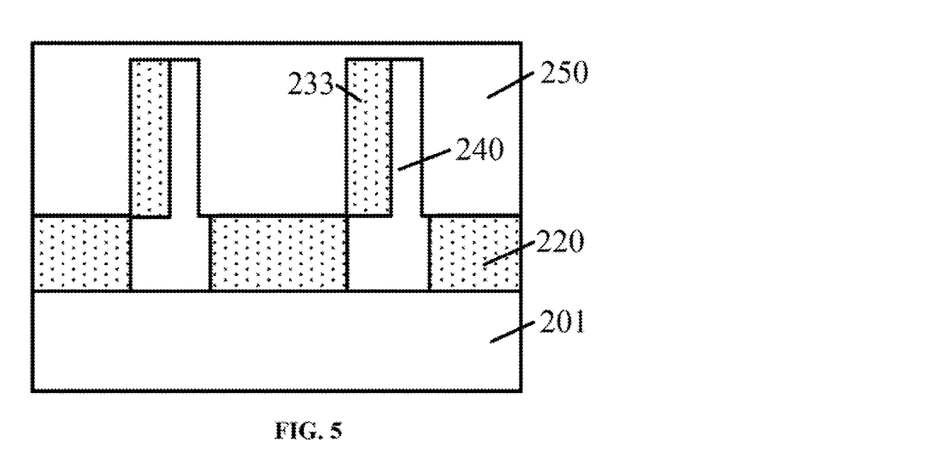
Figure 6:
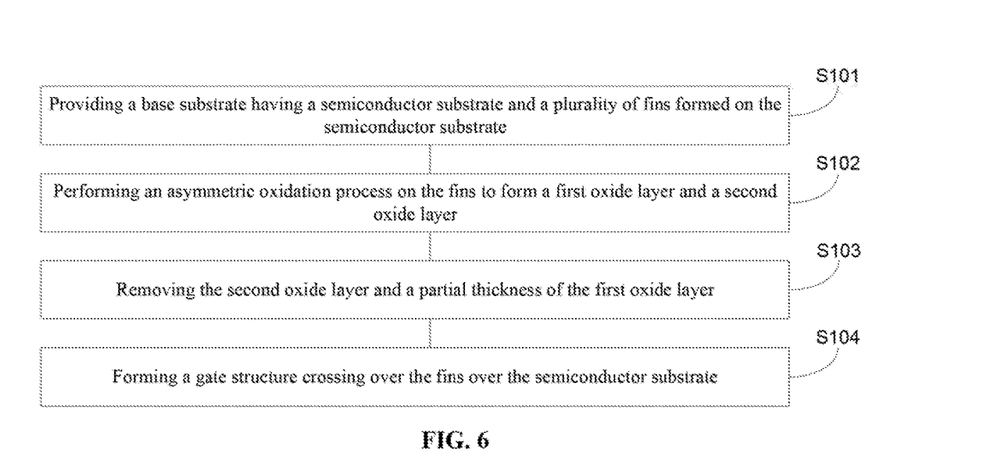
FIG. 6 illustrates an exemplary fabrication process of a semiconductor structure consistent with the disclosed embodiments.

FIG. 6 illustrates an exemplary fabrication process of a semiconductor structure consistent with the disclosed embodiments. FIGS. 1-5 illustrate structure corresponding to certain stages of the exemplary fabrication process.

Figure 1:
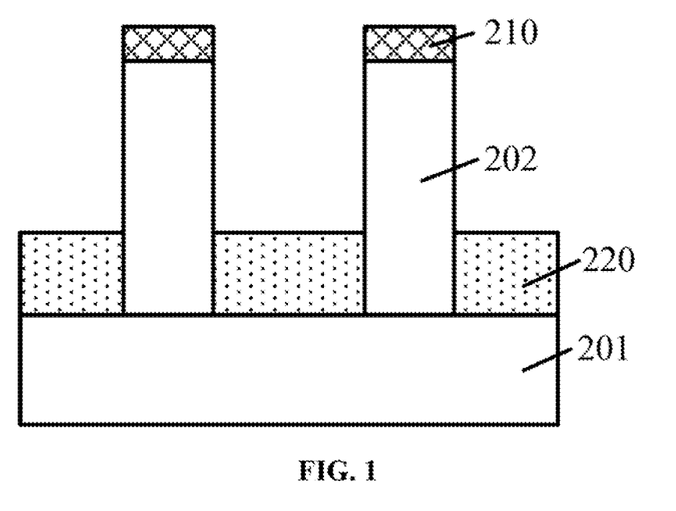
FIGS. 1-5 illustrate structures corresponding to certain stages of an exemplary fabrication process of a semiconductor structure consistent with the disclosed embodiments.

As shown in FIG. 6, at the beginning of fabrication process, a base substrate with certain structures is provided (S101). FIG. 1 illustrates a corresponding structure.

As shown in FIG. 1, a base substrate is provided. The base substrate may include a semiconductor substrate 201, and a plurality of fins 202 formed on a surface of the semiconductor substrate 201. Each fin 202 may include a first sidewall surface and an opposing second sidewall surface.

In one embodiment, the base substrate may include a semiconductor substrate 201, a plurality of fins 202 formed on the SW face of the semiconductor substrate 201, and isolation structures 202 covering portions of the first sidewall surfaces and the second sidewall surfaces formed on the surface of the semiconductor substrate 201. In some embodiments, the base substrate may include a semiconductor substrate; isolation structures formed on the surface of the semiconductor substrate; and fins formed on the surfaces of the isolation structures.

In one embodiment, the fins 20 the semiconductor substrate 201 may be made of different materials. In some embodiments, the fins 202 and the semiconductor substrate 201 may be made of a same material.

Specifically, the semiconductor substrate 201 may be made of silicon. In some embodiments, the semiconductor substrate may be made of germanium, silicon germanium, silicon on insulator (SOI), germanium on insulator (GOI), or silicon germanium on insulator, etc.

In one embodiment, the fins 202 may be made of germanium. In some embodiments, the fins 202 may be made of silicon, or germanium, etc.

In one embodiment, the thickness of the fins 202 may be referred to as the distance between the first sidewall surface and the second sidewall surface of a fin 202. If the thickness of the fins 202 is too small, the thickness of the subsequently formed channel layers may be too small; and the electrical properties of the channel regions of the transistors may be affected. If the thickness of the fins 202 is too large, the control ability of the subsequently formed gate structure on the channel regions may be reduced. In one embodiment, the thickness of fins 202 may be in a range of approximately 10 nm-100 nm.

The process for forming the base substrate may include providing the semiconductor substrate 201. The semiconductor substrate 201 may be crystalline. The semiconductor substrate 201 may provide seed crystals or subsequently forming the fins 202.

After providing the semiconductor substrate 201, a fin material layer may be formed on a surface of the semiconductor substrate 201. The fin material layer may be used to subsequently form the fins 202. Various processes may be used to form the fin material layer, such as an epitaxial growth process, etc.

After forming the fin material layer, a plurality of fins 202 may be formed. The plurality of fins 202 may be used to form channel regions of transistors. The plurality of fins 202 may be formed by patterning the fin material layer.

Further, isolation structures 220 may be formed on the surface of the semiconductor substrate 201. The isolation structures 220 may cover portions of the sidewall surfaces, including the first sidewall surfaces and the second sidewall surfaces, of the fins 202. The isolation structures 202 may be used to electrically isolate the fins 202, and to reduce leakage current.

Specifically, in one embodiment, the semiconductor substrate 201 and the fin material layer are made of single crystalline material(s); and the semiconductor substrate 201 and the fin material layer may have a desired crystal lattice match. The semiconductor substrate 201 may provide seed crystals for the fin material layer.

In one embodiment, the isolation structures 220 are made of silicon oxide. The interface between the silicon oxide and the silicon substrate (the semiconductor substrate 201) may have a relatively small face density. Further, the silicon oxide and the silicon substrate may have a desired bonding strength. In some embodiments, the isolation structures may be made of silicon oxynitride.

In one embodiment, the process for patterning the fin material layer may include forming a mask layer 210 on the surface of the fin material layer. The mask layer 210 may be used to define the positions and sizes of the fins 202. Further, the mask layer 210 may also be used to protect the tops of the fins 202 during a subsequent ion implantation process and a subsequent oxidation process.

After forming the mask layer 210, the fin material layer may be etched until the surface of the semiconductor substrate 201 is exposed. Thus, the plurality of fins 202 may be formed. For illustrative purposes, two fins 202 are illustrated in FIG. 1, although any number of fins may be formed according to various embodiments of the present disclosure.

In one embodiment, the mask layer 210 is made of silicon nitride. In some embodiments, the mask layer 210 may be made of silicon oxide, or silicon oxynitride, etc.

The fin material layer may be etched by any appropriate process. In one embodiment, the fin material layer is etched by an anisotropic dry etching process. The anisotropic dry etching process may be able to better control the surface morphology and feature size of the fins 202. Thus, the anisotropic dry etching process may be able to better control the height and the width of the fins 202.

In one embodiment, the process for forming the isolation structures 220 may include forming an isolation material to cover portions of the surface of the semiconductor substrate 201 among the fins 202, followed by etching the isolation material layer to expose top portions of the fins 202. Thus, the isolation structures 220 may be found among the fins 202; and the top surfaces of the isolation structures 220 may be lower than the top surfaces of the fins 202.

In one embodiment, the mask layer 210 and the isolation structures 220 may be made of different materials. Thus, during the process for etching the isolation maternal layer, the mask layer 210 may not be etched away.

With the continuous increase of the device density of semiconductor structures, the distance between adjacent fins 202 may be correspondingly decreased. Thus, the depth-to-width ratio of the trenches between adjacent fins 202 may be relatively large. To cause the isolation material layer to be able to completely fill the trenches between the adjacent fins 202, the isolation material layer may be formed by a flowable chemical vapor deposition (FCVD) process.

The isolation material layer may be etched by any appropriate process. In one embodiment, a dry etching process may be used to etch the isolation material layer. In some embodiments, the isolation material layer may be etched by a wet etching process.

An asymmetric oxidation process may be subsequently performed on the fins 202 to oxide the first sidewall surfaces of the fins 202 to form a first oxide layer, and to oxide the second sidewall surfaces of the fins 202 to form a second oxide layer. The thickness of the first oxide layer may be greater than the thickness of the second oxide layer. The first oxide layer and the second oxide layer may be separated by the un-oxidized fins 202. The un-oxidized fins 202 may be configured as channel layers of the transistors.

The asymmetric oxidation process may cause the thickness of the first oxide layer on the first sidewall surfaces of the fins 202 to be greater than the thickness of the second oxide layer on the second sidewall surfaces of the fins 202. Thus, during the subsequent process for etching the oxide layers, the entire second oxide layer and a partial thickness of the first oxide layer may be removed. A portion of the first oxide layer may be left on the first sidewall surfaces of the fins 202. The control ability of the gate structure on the carriers in the channel layers of the transistors may be increased. Further, the short channel effect may be reduced; and the leakage current may be decreased.

Figure 2:
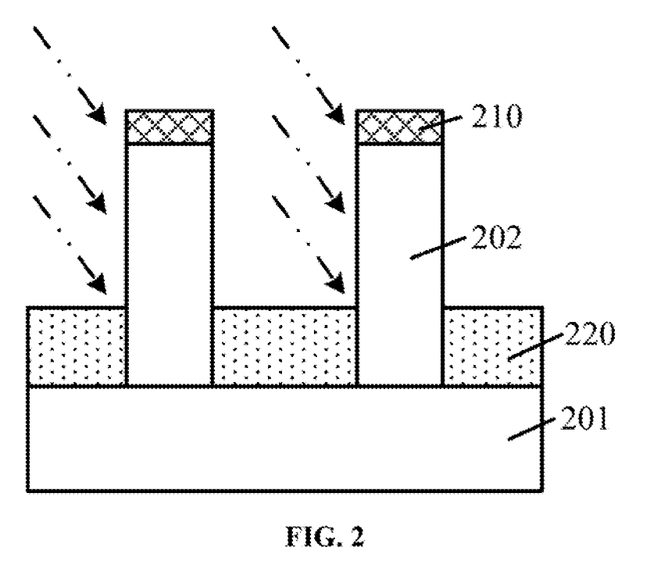
Figure 3:
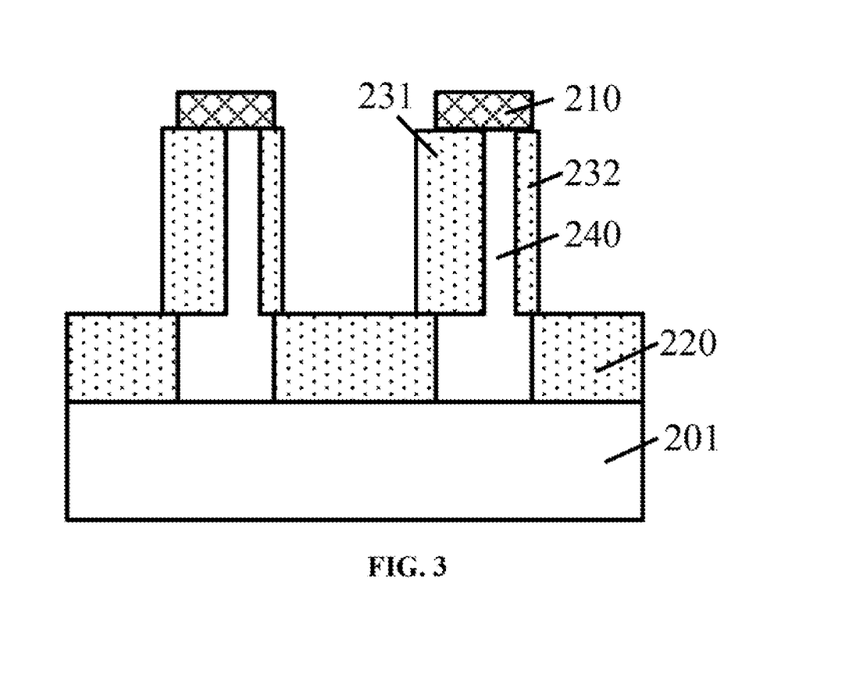

Returning to FIG. 6, after forming the isolation structures 220, an asymmetric oxidation process may be performed (S102). FIGS. 2-3 illustrate corresponding structures.

The asymmetric oxidation process may include a surface modification process. FIG. 2 illustrates an exemplary structure corresponding to the surface modification process.

As shown in FIG. 2, a surface modification process may be performed on the sidewall surfaces of the fins 202. The surface modification process may cause the first sidewall surfaces and the second sidewall surfaces of the fins 202 to have different etching rates during the subsequent etching process. The oxidation rate may be referred to as the etched scales of the fins 202 per unit time during the subsequent etching process.

In one embodiment, the surface modification process may cause the etch rate of the first sidewall surfaces of the fins 202 to be greater than the etching rate of the second sidewall surfaces of the fins 202. That is, the first sidewall surfaces of fins 202 may be easier to be oxidized than the second sidewall surfaces of the fins 202. Thus, during the subsequent oxidation process, the thickness of the first oxide layer formed on the first sidewall surfaces of the fins 202 may be greater than the thickness of the second oxide layer formed the second sidewall surfaces of the fins 202. Accordingly, during the subsequent process for etching the first oxide layer and the second oxide layer, the second oxide layer may be completely removed; and a partial thickness of the first oxide layer may be kept on the first sidewall surfaces of the fins 202.

The surface modification process may be any appropriate process. In one embodiment, the surface modification process is an ion implantation process. After the ion implantation process, the oxidation rate of the first sidewall surfaces of the fins 202 may be greater than the oxidation rate of the second sidewall surfaces of the fins 202.

In one embodiment, during the ion implantation process, the implanted ions may be able to increase the oxidation rate of the fins 202. In some embodiments, the implanted ions may be able to decrease the oxidation rate of the fins 202.

In one embodiment, the ion implantation process may include performing the ion implantation process only on the first sidewall surfaces of the fins 202; and the implanted ions may increase the oxidation rate of the first sidewall surfaces of the fins 202. Thus, the first sidewall surfaces of the fins 202 may be easier to be oxidized. In some embodiments, the ion implantation process may be performed on the first sidewall surfaces of the fins 202 and the second sidewall surfaces of fins 202, respectively; and the implanted ions in one sidewall surfaces of the fins 202 may increase the oxidation rate; and the implanted ions in the other sidewall surfaces fins 202 may decrease the oxidation rate.

In one embodiment, the oxidation rate of first sidewall surfaces of the fins 202 with the implanted ions may be greater than the un-doped (i.e., without the ion implantation process) second sidewall surfaces of the fins 202 in one embodiment, the fins 202 are made of silicon germanium, the ions implanted in the first sidewall surfaces of the fins 202 may be C ions, N ions, P ions, As ions, B ions, Ge ions, Si ions Ar, or Xe ions, etc.

In one embodiment, the ions beam of the ion implantation process may have an angle, i.e., an implanting angle, with the sidewall surfaces of the fins 202. The implanting angle may refer to the angle between the incident angle of the ion beam and the extension direction of the sidewall surfaces of the fins 202.

If the implanting angle of the ion implantation process is relatively large, the implanting ions may be easily blocked by the fins 202; and may be unable to reach the bottom portions of the fins 202, if the implanting angle of the ion implantation process is relatively small, the efficiency of the ion implantation process may be reduced. In one embodiment, the implanting angle of the ion implantation process may be in a range of approximately 2'-45°.

The dosage of the ion implantation process may be in a range of approximately $1E14$ atoms/cm$^2$-$5E16$ atoms/cm$^2$. The energy of the ion implantation process may be in a range of approximately 50 eV-20 keV.

After the surface modification process, an oxidation process may be performed. FIG. 3 illustrates a corresponding semiconductor structure.

As shown in FIG. 3, an oxidation process is performed on the fins 202. The oxidation process may cause the first sidewall surfaces of the fins 202 to be oxidized to form a first oxide layer 231; and cause the second sidewall surfaces of the fins 202 to be oxidized to form a second oxide layer 232.

In each fin 202, the first oxide layer 231 and the second oxide layer 232 may be separated by an un-oxidized portion of a fin 202. The un-oxidized portion of the fin 202 may be configured as a channel layer 240 of the transistor.

The oxidation process may be used to oxidize the fins 202 to form the channel layers 140 with a relatively small thickness, i.e., to reduce the thickness of the fins 202. The first oxide layer 231 may be used to electrically isolate the channel layers 240 from the subsequently formed gate structure. The channel layers 240 may be used to form the channel regions of the transistors.

The oxidization process may be any appropriate process. In one embodiment, the oxidation process is a furnace oxidation process. The furnace oxidation process may be able to precisely control the high temperature oxidation process; and may be able to form a silicon oxide layer with desired performances. In some embodiments, the first oxide layer and the second oxide layer may be formed by a rapid thermal oxidation process, an in-situ steam generation (ISSG) oxidation process, or a soak oxidation process, etc.

The temperature of the oxidation process may be any appropriate value. If the temperature is too low, the oxidation rate may be relatively low, and the non-stoichiometric oxygen in the formed silicon oxide may be relatively high. If the temperature is too high, it may increase the difficulties of the oxidation process. Thus, in one embodiment, the temperature of the oxidation process may be in a range of approximately 400° C.-1100° C.

The thickness of the channel layers 240 may be any appropriate value. If the thickness of the channel layers 240 is too large, the control ability of the subsequently formed gate structure to the channel regions of the transistors may be reduced; and the short channel effect may not be reduced. If the thickness of the channel layers 240 is too small, the electrical properties of the transistors may be affected. In one embodiment, the thickness of the channel layers 240 may be in a range of approximately 8 nm-80 mm.

In one embodiment, the fins 202 (as shown in FIG. 2) are made at silicon germanium, the first oxide layer 231 and the second oxide layer 232 may be made of silicon germanium oxide. In some embodiments, the first oxide layer and the second oxide layer may be made of silicon oxide, or germanium oxide, etc.

The thicknesses of the first oxide layer 231 and the second oxide layer 232 may be any appropriate value. If the thicknesses of the first oxide layer 231 and the second oxide layer 232 are too large, the thickness of the channel layers 240 may be too small; and the properties of the transistors may be affected. If the thicknesses of the first oxide layer 231 and the second oxide layer 232 are too small, the remaining first oxide layer 231 after a subsequent etching process may not have an enough isolation function. In one embodiment, the thickness of the first oxide layer 231 may be in range of approximately 7 nm-120 nm; and the thickness of the second oxide layer 232 may be in a range of approximately 2 nm-20 nm.

Returning to FIG. 6, after forming the first oxide layer 231 and the second oxide layer 232, the second oxide layer 232 and a partial thickness of the first oxide layer 231 may be removed (S103). FIG. 4 illustrates a corresponding semiconductor structure.

As shown in FIG. 4, the second oxide layer 232 and a partial thickness of the first oxide layer 231 are removed. One sidewall surface of each channel layer 240 may be exposed. The portion of the remaining first oxide layer 231 on the first sidewall surface of each fin 202 may be referred to as a side oxide layer 233.

The second oxide layer 231 and the portion of the first oxide layer 232 may be removed by any appropriate process. In one embodiment, a wet etching process is used to remove the second oxide layer 231 and the portion of the first oxide layer 232. The wet etching process may an isotropic etching process; and may have a desired etching selectively. Thus, the second oxide layer 231 and the portion of the first oxide layer 232 may be easily removed. Further, the wet etching process may generate minimum damages to the channel layers 240.

In embodiment, the etching solution of the wet etching process may be a mixture solution having nitric acid and hydrogen fluoride, etc. In some embodiments, the second oxide layer and the portion of the first oxide layer may be removed by an isotropic dry etching process.

During the process for etching the second oxide layer and the partial thickness of the first oxide layer 231, the etching process may be performed until the second oxide layer 232 is entirely removed to expose the sidewall surfaces of the channel layers 240 (corresponding to the second sidewall surfaces of the fins 202). The remaining first oxide layer 231 left on the sidewall surfaces (corresponding to the first sidewall surfaces of the fins 202) of the channel layers 240 may be configured as the side oxide layer 233. Thus, the thickness of the side oxide layer 233 may be determined by the thickness difference between the first oxide layer 231 and the second oxide layer 232. Specifically, the thickness of the side oxide layer 233 may be in a range of approximately 5 nm-100 nm.

Returning to FIG. 6, after removing the second oxide layer 231 and the partial thickness of the first oxide layer 232, a gate structure may be formed (S104). FIG. 5 illustrates a corresponding semiconductor structure.

As shown in FIG. 5, a gate structure 250 is formed over the semiconductor substrate 201 and the channel layers 240. The gate structure 250 may cross over the channel layers 240; and may cover a portion of one sidewall surface of each channel layer 240 and the top surface of the channel layer 240, and a portion of one sidewall surface of the side oxide layer 233. The channel layers 240 under the gate structure 250 may be configured as the channel regions of transistors.

In one embodiment, the gate structure 250 may include a gate electric layer (not labeled) crossing over the channel layers 240 and a gate electrode layer (not labeled) formed on the gate dielectric layer. The gate dielectric layer may cover the portion of one sidewall surface of each channel layer 240, the top surface of the channel layer 240, and the portion of one sidewall surface of the side oxide layer 233.

In one embodiment, the gate dielectric layer may be a high dielectric constant (high-K) dielectric layer. The gate electrode layer may be made of TiAl alloy.

After forming the gate structure 250, source/drain regions (not shown) may be formed in the channel layers 240 at two sides of the gate structure 250. The source/drain regions may be formed by any appropriate process. In one embodiment, the source/drain regions are formed by an epitaxial growth process.

Thus, in the disclosed fabrication method of a semiconductor structure, after the asymmetric oxidation process, the oxide layers framed on two sides of the fins may have different thicknesses. After performing an etching process on the oxide layers, the entire second oxide layer on the second sidewall surfaces of the fins and a partial thickness of the first oxide layer on the first sidewall surfaces of the fins may be removed. Thus, one sidewall surfaces of the fins may still be covered by the remaining first oxide layer; and the channel layers, the un-oxidized portions of the fins, may be relatively thin. Channel regions of the transistor may distribute in the channel layers. Thus, the thickness of the channel layers may be reduced; and the control ability of the gate structure to the channel regions of the transistors be increased. Accordingly, the short channel effect may be reduced; and the leakage current may be reduced.

Further, comparing with the conventional planar transistor structures, the disclosed semiconductor structures may form an "isolation structure-single crystal" structure along a direction perpendicular to the sidewall surfaces of the fins. Thus, the integration level of the semiconductor structure may be increased.

Thus, a semiconductor structure may be formed by the disclosed methods and processes. FIG. 5 illustrates a corresponding semiconductor structure.

As shown in FIG. 5, the semiconductor structure includes a substrate 201; and a plurality of fins (not labeled) protruding from the surface of the semiconductor substrate 201 formed on the surface of the semiconductor substrate 201. Each fin may include a channel layer 240 and a side oxide layer 233 formed on one sidewall surface of the channel layer 240. The side oxide layer 223 may be doped with a certain type of ions. The semiconductor structure may also include isolation structures 220 formed between adjacent fins of the plurality of fins; and a gate structure 250, crossing over the channel layers 240 formed over the semiconductor substrate 201. The gate structure 230 may cover portions of one sidewall surface of each channel layer 240, the top surface of the channel layer 240, and one sidewall surface of the side oxide layer 233. The detailed structures and intermediate structures are described above with respect to the fabrication processes.

Specifically, the semiconductor substrate 201 may be used to form the semiconductor structure. In one embodiment, the semiconductor substrate 201 and the channel layers 240 may be single crystalline. Thus, the semiconductor substrate 201 and the channel layers 240 may have a desired crystal lattice match. The semiconductor substrate 201 may provide seed crystals for the channel layers 240.

The fins may be formed on the semiconductor substrate 201. The fins may include the channel layer 240 formed on the semiconductor substrate 201 and the side oxide layer 233 formed on one sidewall surface of each channel layer 240. The side oxide layer 233 may be doped with a certain type of ions.

The channel layers 240 may be used to form channel regions of transistors. The side oxide layer 233 may be used to electrically isolate the channel layers 240 and the gate structure 250.

In one embodiment, the channel layers 240 are made of silicon germanium. In some embodiments, the channel layers may be made of silicon, or germanium.

If the thickness of the channel layers 240 is too large, the control ability of the gate structure 250 to the channel regions may be affected; and me short channel effect may not be reduced. If the thickness of the channel layers 240 is too small, the electrical properties of the channel regions of the transistors may be affected. In one embodiment, the thickness of the channel layers 240 may be in a range of approximately 8 nm-80 nm.

In one embodiment, the channel layers 240 may be made of silicon germanium; and the side oxide layer 233 may be made of a combination of silicon oxide and germanium oxide. In some embodiments, the side oxide layer may be made of silicon oxide, or germanium oxide, etc.

If the thickness of the side oxide layer 233 is too large, it may cause the thickness of the channel layers 240 to be too small, the electrical properties of the transistors may be affected. If the thickness of the side oxide layer 233 is too small, the side oxide layer 233 may not have an enough isolation property. In one embodiment, the thickness of the side oxide layer 233 may be in a range of approximately 5 nm-100 nm.

In one embodiment, the ions doped into the side oxide layer 233 may include C, N, P, As, B, Ge, Si, Ar, or Xe, etc.

The isolation structures 220 may cover portions of sidewall surfaces of the fins. The isolation structures 220 may be used to electrically isolate adjacent fins.

Further, the fins may also include fin bases (not labeled). In some embodiments, the fins bases may be optional; and may be omitted. The isolation structures may be formed on the surface of the semiconductor substrate; and the fins may be formed on the surfaces of the isolation structures.

In one embodiment, the isolation structures 220 may be made of silicon oxide. The silicon oxide and the silicon substrate may have a relatively low surface density; and the adhesions strength between the silicon oxide and the silicon substrate may be increased. In some embodiments, the isolation structures may be made of silicon oxynitride, etc.

In one embodiment, the fin bases and the channel layers 240 may be made of a same material. Specifically, the fins bases may be made of silicon germanium.

The gate structure 250 may cross over the channel layers 240; and may cover the portion of one sidewall surface of each channel layer 240, the top surfaces of the channel layers 240, and one sidewall surface of the side oxide layer 233. The channel layers 240 under the gate structure 250 may be configured as the channel regions of the transistors.

In one embodiment, the gate structure 250 may include a gate dielectric layer (not labeled) covering the portion of one sidewall surface of each channel layer 240, the top surfaces of the channel layers 240, and one sidewall surface of the side oxide layer 233, and a gate electrode layer formed on the gate dielectric layer.

In one embodiment, the gate dielectric layer may be made of a high-K dielectric material. The gate electrode layer may be made of TiAl alloy, etc.

The semiconductor structure may also include source/drain regions formed in the channel layers 240 at two sides of the gate structure 250. The gate structure 250 and the source/drain regions may be formed by any appropriate process.

Thus, according to the disclosed semiconductor structure one sidewall surface of the channel layer may be covered by a side oxide layer; and the channel layer may be relatively thin; and the channel region of the transistor may only distribute in the channel layer. The relatively thin channel layer may increase the control ability of the gate structure; and the short channel effect may be reduced. Further, comparing with the conventional planar transistor structure, the disclosed semiconductor structure may form an "isolation structure single crystal" structure along a direction perpendicular to the sidewall surfaces of the fins. Thus, the integration level of the semiconductor structure may be increased.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
    providing a semiconductor substrate;
    forming a plurality of fins on the semiconductor substrate, each fin having a first sidewall surface and an opposing second sidewall surface;
    performing an asymmetric oxidation process on the fins to oxidize the first sidewall surfaces of the fins to form a first oxide layer, and to oxidize the second sidewall surfaces of the fins to form a second oxide layer, a thickness of the first oxide layer being different from a thickness of the second oxide layer, and un-oxidized portions of the fins between the first oxide layer and the second oxide layer being configured as channel layers;

removing the second oxide layer and a partial thickness of the first oxide layer; and forming a gate structure crossing over the channel layers over the semiconductor substrate.

2. The method according to claim 1, wherein the asymmetric oxidation process comprises:

performing a surface modification process on the fins to cause the first sidewall surfaces of the fins and the second sidewall surfaces of the fins to have different oxidation rates; and performing an oxidation process to form the first oxide layer on the first sidewall surfaces of the fins and the second oxide layer on the second sidewall surfaces of the fins.

3. The method according to claim 2, wherein the surface modification process comprises:

performing an ion implantation process on sidewall surfaces of the fins.

4. The method according to claim 3, wherein the surface modification process comprises:

performing the ion implantation process on the first sidewall surfaces of the fins with one or more of C ions, N ions, P ions, As ions, B ions, Ge ions, Si ions, Ar ions, and Xe ions.

5. The method according to claim 4, wherein:

the ion implantation process is performed on the first sidewall surface and the opposing second sidewall surface, respectively.

6. The method according to claim 3, wherein:

an implanting angle of the ion implantation process is in a range of approximately 2°-45°.

7. The method according to claim 3, wherein:

a dosage of the ion implantation process is in a range of approximately 1E14 atoms/cm$^2$-5E16 atom/cm$^2$; and an energy of the ion implantation process is in a range of approximately 50 eV-20 keV.

8. The method according to claim 2, wherein:

the oxidation process includes one of a furnace oxidation process, an in-situ steam generation oxidation process, a soak oxidation process, and a rapid thermal oxidation process.

9. The method according to claim 8, wherein:

a temperature of the furnace oxidation process is in a range of approximately 400° C.-1100° C.

10. The method according to claim 1, further comprising:

forming isolation structures on the semiconductor substrate between adjacent fins.

11. The method according to claim 10, wherein:

the isolation structures cover portions of the first sidewall surface and the opposing second sidewall surface.

12. The method according to claim 1, wherein forming a plurality of fins comprises:

providing a base substrate;

forming a mask layer defining sizes and positions of the plurality of fins to be formed on the base substrate; and etching the base substrate using the mask layer as an etching mask.

13. The method according to claim 12, wherein:

the mask layer and the isolation structures are made of different materials.

14. The method according to claim 1, wherein:

a thickness of the first oxide layer is in a range of approximately 7 nm-120 nm; and a thickness of the second oxide layer is in a range of approximately 2 nm-20 nm.

15. The method according to claim 1, wherein:

a thickness of a remaining first oxide layer after removing the second oxide layer and the partial thickness of the first oxide layer is in a range of approximately 5 nm-100 nm.

16. The method according to claim 1, wherein:

a thickness of the channel layers is in a range of approximately 8 nm-80 nm.

17. The method according to claim 1, wherein:

a width of the fins is in a range of approximately 10 nm-100 nm.

18. The method according to claim 1, wherein:

the second oxide layer and the partial thickness of the first oxide layer are removed by a wet etching process.

19. The method according to claim 1, wherein:

the plurality of fins are made of silicon germanium.

20. The method according to claim 1, wherein:

the first oxide layer and the second oxide layer are made of silicon germanium oxide.

* * * * *